(12) United States Patent
Renau

(10) Patent No.: US 6,828,204 B2
(45) Date of Patent: Dec. 7, 2004

(54) METHOD AND SYSTEM FOR COMPENSATING FOR ANNEAL NON-UNIFORMITIES

(75) Inventor: Anthony Renau, West Newbury, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 32 days.

(21) Appl. No.: 10/272,166

(22) Filed: Oct. 16, 2002

(65) Prior Publication Data
US 2004/0077149 A1 Apr. 22, 2004

(51) Int. Cl.[7] .................................... H01L 21/336
(52) U.S. Cl. ............... 438/308; 438/301; 438/306; 438/307
(58) Field of Search .................. 438/308, 301, 438/306, 307

(56) References Cited

U.S. PATENT DOCUMENTS

| | | | | |
|---|---|---|---|---|
| 6,049,220 A | * | 4/2000 | Borden et al. | 324/765 |
| 6,124,178 A | * | 9/2000 | Sung et al. | 438/308 |
| 6,326,219 B2 | * | 12/2001 | Markle et al. | 438/14 |
| 6,489,801 B1 | * | 12/2002 | Borden et al. | 324/766 |
| 6,594,446 B2 | * | 7/2003 | Camm et al. | 392/416 |

* cited by examiner

Primary Examiner—John F. Niebling
Assistant Examiner—Olivia T. Luk

(57) ABSTRACT

A method and system can compensate for anneal non-uniformities by implanting dopant in a pattern to provide higher dopant concentrations where the anneal non-uniformities result in lower active dopant concentrations. A pattern for the anneal non-uniformities may be determined by annealing a wafer having a uniform dopant distribution and measuring properties of the wafer after annealing, e.g., by obtaining a sheet resistance map of the wafer. In one embodiment, the non-uniformities may be measured by measuring temperature variations during annealing.

24 Claims, 4 Drawing Sheets

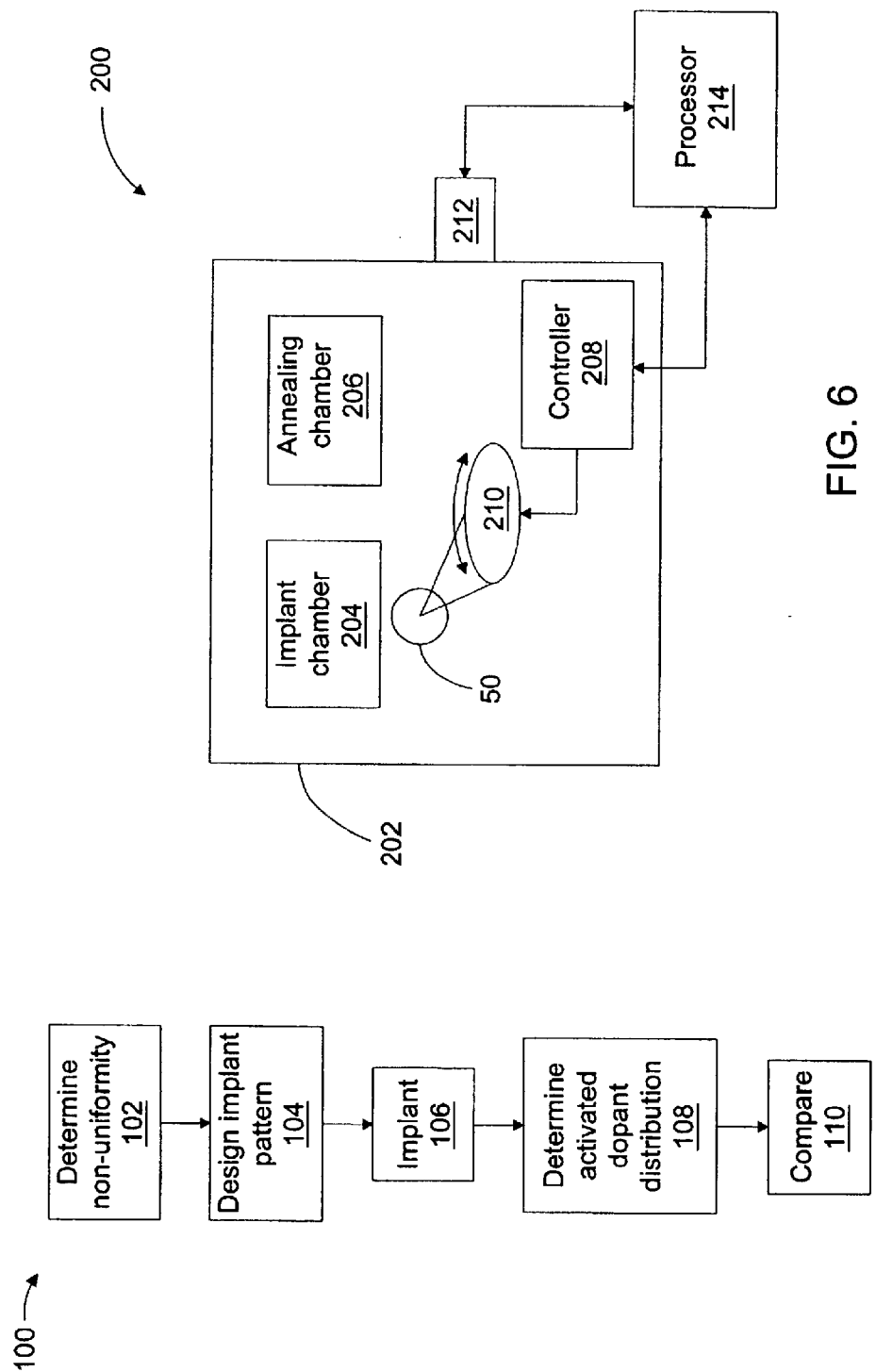

METHOD AND SYSTEM FOR COMPENSATING FOR ANNEAL NON-UNIFORMITIES

RELATED APPLICATIONS

There are no related applications.

FIELD

The methods and systems relate to annealing of silicon wafers, and more particularly to compensating for anneal non-uniformities.

BACKGROUND

Following ion implantation in a silicon wafer, the dopant may be activated to provide the required electrical properties to the silicon. The dopant activation may be typically done by thermally cycling, or annealing, the wafer. The annealing process may be controlled to provide the required electrical properties including controlling the maximum temperature that the wafer may be subjected to, the time the wafer may be maintained at the maximum temperature and the rate or rates at which the temperature is raised and decreased.

In addition, control of the annealing process may serve to minimize deleterious effects, such as out-diffusion. Out-diffusion may result from dopant within the silicon diffusing to and eventually leaving the surface of the wafer. The rate of out-diffusion can be dependent on temperature. Also, the dopant concentration within the wafer may decrease at a higher rate when the dopant is nearer the surface of the wafer. For example, dopant concentration in ultra shallow implants can be particularly prone to reduction due to out-diffusion.

A non-uniform temperature distribution across the wafer during an anneal cycle can lead to non-uniform dopant activation, non-uniform out-diffusion rates, as well as other deleterious effects that may cause asymmetric activation of the dopant to occur. Thus, an initially uniform dopant distribution may not necessarily produce uniform electrical properties across the wafer after anneal. This can be measured, for example, by sheet resistance (Rs) maps. Generally, the temperature gradients across a wafer during annealing tend to be radial, with the center of the wafer being slightly hotter than the edges. When this occurs, it can result in radial variations in the electrically activated dopant distribution profiles as shown in FIG. 7.

SUMMARY

According to the methods and systems described herein, a method of compensating for anneal non-uniformities may comprise implanting dopant in a pattern to provide higher dopant concentrations where the anneal non-uniformities result in lower electrically active dopant concentrations. A pattern for the anneal non-uniformities may be determined by annealing a wafer having a uniform dopant distribution and measuring properties of the wafer after annealing, e.g., by obtaining a sheet resistance map of the wafer. In one embodiment, the non-uniformities may be measured by measuring temperature variations during annealing. The beam current density across the beam and the pass angle of the wafer through the beam may be adjusted to obtain the pattern for implanting the dopant. Computer readable medium may contain instructions to control a wafer implanter to implement the method.

A system for compensating for anneal non-uniformities may comprise means for determining the anneal non-uniformities, means for designing an implant pattern providing higher dopant concentrations where the anneal non-uniformities result in lower active dopant concentrations and means for implanting dopant in the implant pattern. The system may include means for annealing a sample wafer and means for measuring the properties of the sample wafer after annealing, such as by measuring sheet resistance. In one embodiment, means for measuring temperature variations during annealing may determine the anneal non-uniformities.

In one embodiment, the system may comprise a sensor to determine anneal non-uniformity data, a processor to design the implant pattern based on the anneal non-uniformity data and a controller to control the implantation of the wafer to implant dopant in the implant pattern designed. The sensor may measure sheet resistance, or alternately, may measure temperature variations during annealing. The controller may adjust the beam current density across the beam and/or the pass angle of the wafer through the beam.

BRIEF DESCRIPTION OF THE DRAWINGS

The following figures depict certain illustrative embodiments of the systems and methods in which like reference numerals refer to like elements. These depicted embodiments are to be understood as illustrative and not as limiting in any way.

FIG. 5 may depict a flow diagram of a method for compensating for anneal non-uniformities;

FIG. 6 may show a schematic representation of a system for implementing the method of FIG. 5.

DETAILED DESCRIPTION OF THE PREFERRED EMBODIMENT

Figure 7:
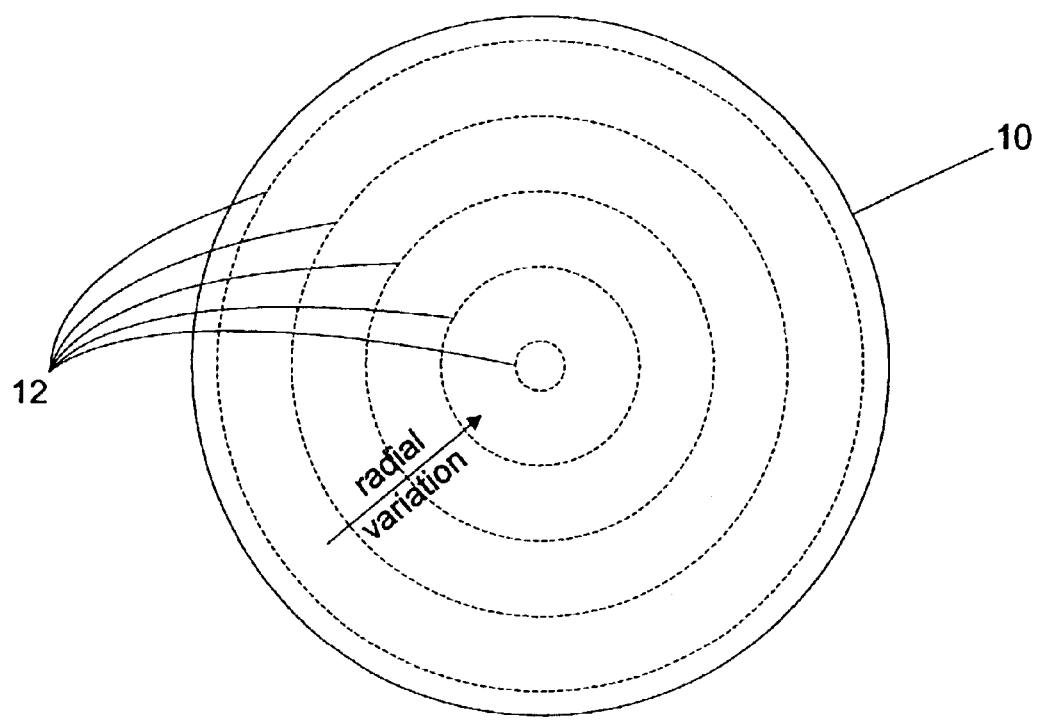
FIG. 7 shows a schematic representation of electrically active dopant distribution on a wafer following anneal of a uniformly implanted dopant distribution.

As shown in FIG. 7, a uniform dopant distribution on a wafer 10, may lead to a radially varying electrically active dopant distribution profile due to the typical radial temperature gradients encountered by the wafer 10 during annealing. In FIG. 7, the higher center temperature may lead to increased electrical activation of the dopant at the center of wafer 10. The higher center temperature may also lead to increased out-diffusion at the center of wafer 10. Thus, the profile contour lines 12 may denote decreasing or increasing electrically active dopant concentrations going towards the center of wafer 10.

Figure 1:
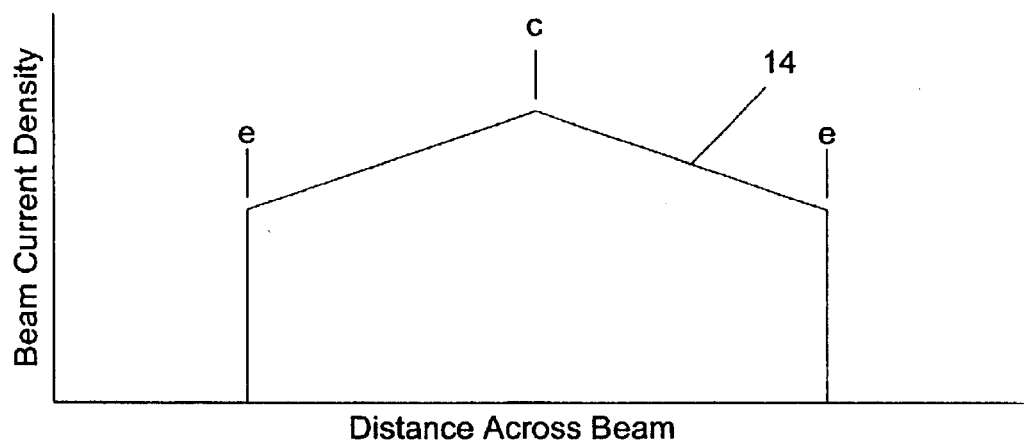
FIG. 1 shows a schematic representation of a non-uniform beam profile for implanting a wafer.
Figure 2:
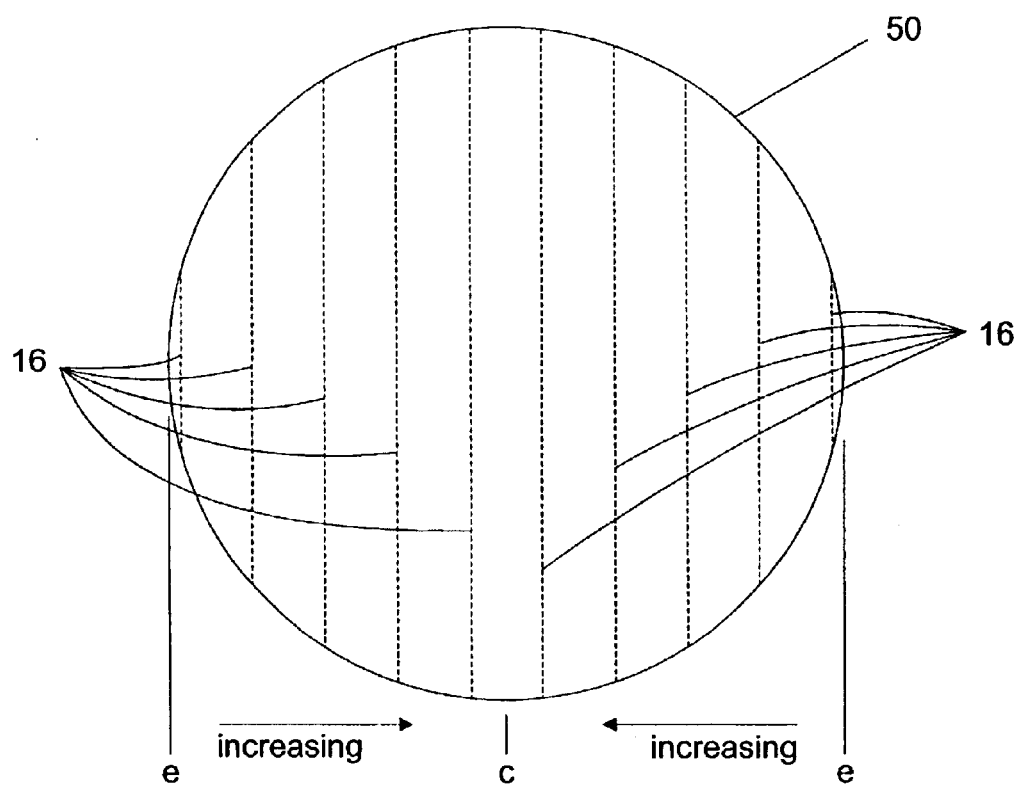
FIG. 2 shows a schematic representation of dopant distribution on a wafer after a first pass of the beam of FIG. 1.

Referring now to FIG. 1, there can be shown a schematic representation of a beam profile 14 that may assist in compensating for radial temperature gradients during annealing. The following description may be based on the radial variation in the activated dopant concentration decreasing towards the center of wafer 10. However, it can be understood that the methods and systems described herein may be applicable to other variations. In FIG. 1, the beam current density may be seen to vary across the width of the beam. For the illustrative example shown in FIG. 1, the beam current density may be greatest in the center of the beam (designated "c" in FIG. 1) and may decrease linearly towards the edges of the beam (designated "e" in FIG. 1). FIG. 2 may show illustrative implanted dopant distribution contour lines for a wafer 50 passed vertically through the non-uniform beam of FIG. 1, i.e., the beam may be normal to the plane of FIG. 2, with the wafer 50 moved vertically in the plane of FIG. 2. The contour lines 16 may indicate increasing dopant concentration going from the edges "e" towards the center "c".

Figure 3:
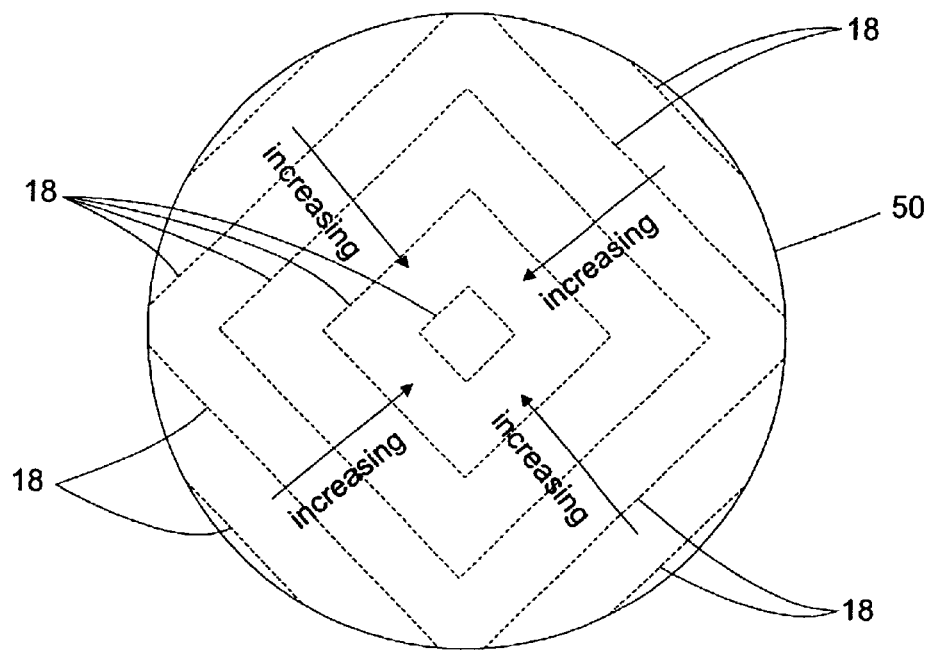
FIG. 3 shows a schematic representation of dopant distribution on the wafer after a second pass of the beam of FIG. 1, rotated 90° from the first pass.
Figure 4:
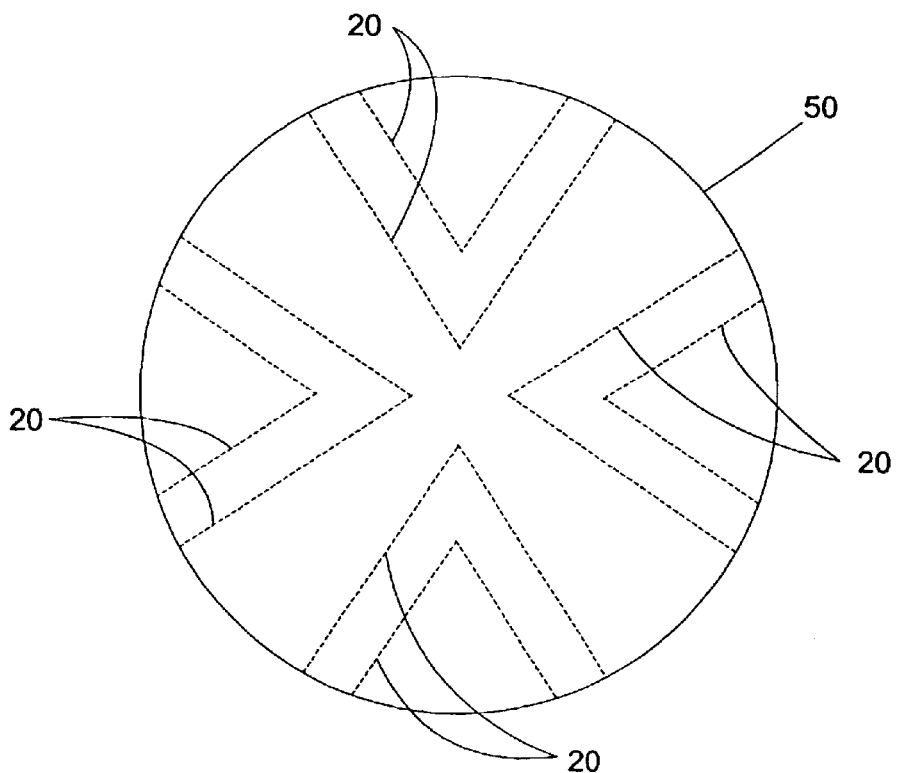
FIG. 4 shows a schematic representation of the electrically activated dopant distribution on the wafer of FIG. 3 after anneal.

Referring to FIG. 3, there may be shown dopant distribution contour lines for the wafer 50 passed vertically and horizontally (with respect to the plane of FIG. 3) through the non-uniform beam of FIG. 1. The contour lines 18 may indicate increasing dopant concentration going towards the center of wafer 50. It can be seen from a comparison of FIGS. 3 and 7 that the increasing implanted dopant concentrations on the wafer 50 of FIG. 3 may counterbalance the decreasing electrically activated dopant concentrations on wafer 10 of FIG. 7. Thus, an anneal of the wafer 50 of FIG. 3, where the anneal temperature may increase radially going towards the center of the wafer 50, may yield a wafer 50 with an electrically active dopant distribution similar to that of FIG. 4. It can be seen generally that there can be less variation in electrically active dopant distribution on wafer 50 of FIG. 4 (as indicated by the relatively few contour lines 20) when compared to the wafer 10 of FIG. 7.

For illustrative purposes, one can assign values to contours 12 of FIG. 7 based on typical measured values for uniform implanted dopant distribution followed by an anneal with radially varying temperature. Based on measured sheet resistance using standard annealing equipment, the electrical uniformity for FIG. 7 may be 1% and the total variation from center to edge may be 4.24%. For the non-uniform beam of FIG. 1, the center beam current density may be taken at 7% higher than at the edges. Using this value for current beam density, the expected uniformity of the dopant distribution for the wafer 50 in FIG. 3 may be determined to be 0.96% with a total variation of 4.34%. Using the same radially varying temperature anneal as in FIG. 7, the overall uniformity of the electrically activated dopant distribution for the wafer 50 of FIG. 4 may be determined to be 0.28% and the total variation may be 1.29%.

It can be seen from this illustration that the uniformity of the electrically activated dopant distribution may be significantly increased and the variability of the electrically activated dopant distribution may be significantly decreased by having the beam dopant implant pattern counterbalance the expected electrically active dopant distribution pattern resulting from the anneal temperature variations. FIG. 5 may depict a flow diagram of a method 100 that can be used in compensating for anneal non-uniformities.

Method 100 first determines, at 102, the non-uniformity caused by the particular annealer being used. For example, a sample wafer with a uniform implant can be annealed and the non-uniformity may be determined from measurements of the properties of a sample wafer after anneal, such as may be provided by a sheet resistance (Rs) map. Alternately, the temperature variations at the wafer during anneal may be measured directly, e.g., through the use of temperature sensitive coatings on a wafer, or temperature probes during annealing. Other methods for determining the non-uniformity, as may be known to those of skill in the art, may be used without limitation to the implementation of the method 100. An implant pattern may then be designed, at 104, that can provide a dopant distribution to compensate for the non-uniformities in the anneal and the wafer may be implanted (106) using the designed pattern. Generally, the implant pattern can be designed to provide higher dopant concentrations at areas on the wafer where annealing may result in lower electrically active concentrations.

For the illustrative example of FIGS. 1–4, the beam profile may be peaked at the center to provide greater dopant implantation near the center of the wafer. It may be known that implantation equipment may have rotating platens where the wafer is held during implant. With equipment of this type, the illustrative implant may be broken into four segments, with a quarter dose per segment and with the wafer rotating 90° between segments. Such an implant can be easily done on a single wafer tool without significant impact on throughput.

For other anneal non-uniformity patterns, other implant patterns may be designed or chosen. For example, if the anneal non-uniformity resulted in higher electrically active dopant concentrations at the center of the wafer, the beam profile may be designed such that it can peak at its edges. It can be seen that other beam profile shapes, dosages, wafer pass angles, etc., may provide a wide variety of implant patterns by which dopant can be inhomogeneously distributed during implantation in order to compensate for the non-uniformities introduced by an annealer.

Once annealed at 106, the activated dopant distribution for the wafer may be determined at 108. For the illustrative embodiment of FIGS. 1–5, a sheet resistance map may be used to determine the activated dopant distribution. However, it can be understood by those of skill in the art that other measurement methods may be used without limitation to the implementation of method 100. The activated dopant distribution from 108 may be compared, at 110, with the expected activated distribution determined at 102 to estimate the benefit of implementing the method 100. As noted for the above illustrated example, the method 100 may involve costs in equipment set-ups, throughputs and/or other aspects of the implant/anneal process. Such costs can be weighed against the benefits, as shown by the comparison at 110, to aid in deciding whether the method 100 may be used.

Referring to FIG. 6, a schematic representation of a system 200 for implementing the method 100 may be shown. System 200 may include a wafer processing station 202 having an implant chamber 204 and an annealing chamber 206. Processing station 202 may also include a controller 208 for controlling the implant process, e.g., beam profile, pass angle, and/or other implant parameters, and a transfer mechanism 210 for moving the wafer 50 between stations. The processing station 202 can be equipment known in the art for implanting wafers. A measuring device 212 may determine the wafer non-uniformity as at 102 and 108. As one example, the measuring device may measure sheet resistance, as described above, to determine wafer non-uniformity. Other devices as may be known in the art for determining non-uniformity may be used. A processor 214 may aid in designing the implant pattern at 104 and comparing the results at 110.

While the methods and systems have been disclosed in connection with the preferred embodiments shown and described in detail, various modifications and improvements thereon will become readily apparent to those skilled in the art. As an example, the processor 214 may control the operation of processing station 202, providing instructions to controller 208 as necessary. Additionally, measuring device 212 and processor 214 may be incorporated into processing station 202, or one or more of the components 204–210 may be stand-alone components. Thus, the arrangement of the components shown in FIG. 6 and the items shown in FIG. 5 may be merely for illustrative purposes and can be varied to suit the particular implementation of interest. Accordingly, items may be combined, expanded, or otherwise reconfigured without departing from the scope of the disclosed methods.

The methods and systems described herein may not be limited to particular hardware or software configuration, and may find applicability in many processing environments where robots may be used to position a payload at a station. The methods can be implemented in hardware or software, or a combination of hardware and software. The methods can be implemented in one or more computer programs executing on one or more programmable computers that include a processor, such as processor 214, a storage medium readable by the processor, one or more input devices, and one or more output devices. In some embodiments, such as that of FIG. 6, a processing system may be used. In other embodiments, the methods may be implemented on a computer in a network. User control for the systems and methods may be provided through known user interfaces.

The computer program, or programs, may be preferably implemented using one or more high level procedural or object-oriented programming languages to communicate with a computer system; however, the programs can be implemented in assembly or machine language, if desired. The language can be compiled or interpreted.

The computer programs can be preferably stored on a storage medium or device (e.g., CD-ROM, hard disk, or magnetic disk) readable by a general or special purpose programmable computer for configuring and operating the computer when the storage medium or device may be read by the computer to perform the procedures described herein. The method and system can also be considered to be implemented as a computer-readable storage medium, configured with a computer program, where the storage medium so configured may cause a computer to operate in a specific and predefined manner.

The aforementioned changes may also be merely illustrative and not exhaustive, and other changes can be implemented. Accordingly, many additional changes in the details and arrangement of parts, herein described and illustrated, can be made by those skilled in the art. It will thus be understood that the following claims may not to be limited to the embodiments disclosed herein. The claims can include practices otherwise than specifically described and are to be interpreted as broadly as allowed under the law.

What is claimed is:

1. A method of compensating for anneal non-uniformities, comprising implanting dopant in a pattern to provide higher dopant concentrations where the anneal non-uniformities result in lower electrically active dopant concentrations.

2. The method of claim 1, comprising determining a pattern for the anneal non-uniformities.

3. The method of claim 2, wherein determining the pattern for the anneal non-uniformities comprises:
   annealing a sample wafer having a uniform dopant distribution; and
   measuring properties of the sample wafer after annealing.

4. The method of claim 3, wherein measuring properties comprises measuring sheet resistance.

5. The method of claim 2, wherein determining the pattern for the anneal non-uniformities comprises measuring temperature variations during annealing.

6. The method of claim 1, wherein implanting dopant in a pattern comprises adjusting at least one of a beam current density across a beam used to implant the dopant in a wafer and a pass angle of the wafer through the beam.

7. The method of claim 6, comprising:
   annealing a sample wafer having a uniform dopant distribution; and
   measuring properties of the sample wafer after annealing to determine a pattern for the anneal non-uniformities.

8. The method of claim 7, wherein measuring properties comprises measuring sheet resistance.

9. A computer-readable medium containing instructions for controlling a wafer implanter to compensate for anneal non-uniformities by controlling the wafer implanter to implant dopant in a pattern on the wafer that provides higher dopant concentrations where the anneal non-uniformities result in lower electrically active dopant concentrations.

10. The computer readable medium of claim 9, containing instructions for controlling the wafer implanter to determine a pattern for the anneal non-uniformities.

11. The computer readable medium of claim 10, containing instructions for controlling the wafer implanter to determine a pattern for the anneal non-uniformities by:
   controlling the wafer implanter to anneal a sample wafer having a uniform dopant distribution; and
   controlling the wafer implanter to measure properties of the sample wafer after annealing.

12. The computer readable medium of claim 11, containing instructions for controlling a wafer implanter to measure properties of the sample wafer by controlling the wafer implanter to measure sheet resistance.

13. The computer readable medium of claim 10, containing instructions for controlling a wafer implanter to determine a pattern for the anneal non-uniformities by controlling the wafer implanter to measure temperature variations during annealing.

14. The computer-readable medium of claim 9, containing instructions for controlling a wafer implanter to implant dopant in a pattern by controlling the implanter to adjust at least one of a beam current density across a beam used to implant the dopant in the wafer and a pass angle of the wafer through the beam.

15. A system for compensating for anneal non-uniformities in a wafer implanter, comprising:
   a sensor to determine and output anneal non-uniformity data;
   a processor to receive the anneal non-uniformity data from the sensor and to design an implant pattern that provides higher dopant concentrations where the anneal non-uniformity data indicates lower active dopant concentrations;
   a controller to control the wafer implanter to implant dopant in the implant pattern.

16. The system of claim 15, wherein the sensor measures sheet resistance.

17. The system of claim 15, wherein the sensor is a temperature sensor to measure temperature variations during annealing.

18. The system of claim 15, wherein the controller comprises:
   a beam current density controller to vary the beam current density across a beam used to implant the dopant in the wafer; and a pass angle controller to vary the pass angle of the wafer through the beam.

19. A system for compensating for anneal non-uniformities, comprising:

means for determining the anneal non-uniformities;

means for designing an implant pattern providing higher dopant concentrations where the anneal non-uniformities result in lower active dopant concentrations; and means for implanting dopant in the implant pattern.

20. The system of claim 19, comprising means for determining a pattern for the anneal non-uniformities.

21. The method of claim 20, wherein the means for determining the pattern for the anneal non-uniformities comprises:

means for annealing a sample wafer having a uniform dopant distribution; and means for measuring properties of the sample wafer after annealing.

22. The method of claim 21, wherein the means for measuring properties comprises means for measuring sheet resistance.

23. The method of claim 20, wherein the means for determining the pattern for the anneal non-uniformities comprises means for measuring temperature variations during annealing.

24. The method of claim 19, wherein the means for implanting dopant in a pattern comprises at least one of means for adjusting a beam current density across a beam used to implant the dopant in a wafer and means for adjusting a pass angle of the wafer through the beam.

* * * * *